(12) United States Patent
Yamato et al.

(10) Patent No.: US 9,197,192 B2
(45) Date of Patent: Nov. 24, 2015

(54) ELECTRONIC COMPONENT INCLUDING A SURFACE ACOUSTIC WAVE ELEMENT AND A PILLAR MEMBER

(71) Applicant: Murata Manufacturing Co., Ltd., Nagaokakyo-shi, Kyoto-fu (JP)

(72) Inventors: Syuji Yamato, Nagaokakyo (JP); Mitsuyoshi Hira, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 154 days.

(21) Appl. No.: 14/014,839

(22) Filed: Aug. 30, 2013

(65) Prior Publication Data

US 2013/0335171 A1 Dec. 19, 2013

Related U.S. Application Data

(63) Continuation of application No. PCT/JP2012/053101, filed on Feb. 10, 2012.

(30) Foreign Application Priority Data

Mar. 9, 2011 (JP) .................................. 2011-051122

(51) Int. Cl.
*H03H 9/64* (2006.01)
*H03H 9/05* (2006.01)
*H03H 9/10* (2006.01)

(52) U.S. Cl.
CPC ................. *H03H 9/64* (2013.01); *H03H 9/059* (2013.01); *H03H 9/1085* (2013.01); *H03H 9/1092* (2013.01); *H03H 9/6483* (2013.01)

(58) Field of Classification Search
CPC .......... H03H 9/02834; H03H 9/02937; H03H 9/058; H03H 9/059; H03H 9/08; H03H 9/1085; H03H 9/1092; H03H 9/6483; H03H 9/64
USPC ....................... 333/193–196, 133; 310/313 R, 310/340–342, 346
See application file for complete search history.

(56) References Cited

U.S. PATENT DOCUMENTS 4,965,479 A * 10/1990 Elliott et al. ............... 310/313 D
5,831,369 A * 11/1998 Furbacher et al. ........ 310/313 R
(Continued)

FOREIGN PATENT DOCUMENTS

DE            102 53 163 A1     5/2004
DE      10 2005 026 243 A1    12/2006
(Continued)

OTHER PUBLICATIONS

Official Communication issued in corresponding German Patent Application No. 11 2012 001 150.3, mailed on May 20, 2014.
(Continued)

*Primary Examiner* — Barbara Summons
(74) *Attorney, Agent, or Firm* — Keating & Bennett, LLP

(57) ABSTRACT

An electronic component includes a support layer that surrounds an element region on a principal surface of a piezoelectric substrate, when viewed in plan from a z-axis direction. A surface acoustic wave element is provided in the element region. A cover layer is provided on the support layer, and is opposed to the principal surface. A pillar member connects the principal surface and the cover layer in a space surrounded by the principal surface, the support layer, and the cover layer, and does not contact with the support layer.

19 Claims, 6 Drawing Sheets

(56) References Cited

U.S. PATENT DOCUMENTS

| | | |
|---|---|---|
| 7,102,224 B2 | 9/2006 | Pahl |
| 7,298,231 B2 * | 11/2007 | Ikuta et al. .................... 333/133 |
| 8,294,535 B2 | 10/2012 | Feiertag et al. |
| 2001/0033120 A1 | 10/2001 | Kobayashi et al. |
| 2004/0232802 A1 | 11/2004 | Koshido |
| 2007/0057597 A1 * | 3/2007 | Aoki .......................... 310/313 B |
| 2007/0252481 A1 | 11/2007 | Iwamoto et al. |
| 2008/0266023 A1 * | 10/2008 | Tanaka ......................... 333/133 |
| 2009/0051245 A1 * | 2/2009 | Takayama et al. ........ 310/313 R |
| 2009/0160290 A1 | 6/2009 | Tsuda et al. |
| 2009/0201102 A1 * | 8/2009 | Oda .............................. 333/193 |
| 2009/0224851 A1 * | 9/2009 | Feiertag et al. ............... 333/186 |
| 2010/0038992 A1 | 2/2010 | Moriya et al. |
| 2011/0084573 A1 * | 4/2011 | Yamaji et al. ................. 310/340 |
| 2014/0003017 A1 * | 1/2014 | Kai et al. ...................... 361/783 |

FOREIGN PATENT DOCUMENTS

| | | | |
|---|---|---|---|
| JP | 2001-094390 A | | 4/2001 |
| JP | 2001-185976 A | | 7/2001 |
| JP | 2004-129223 A | | 4/2004 |
| JP | 2005-252335 | * | 9/2005 |
| JP | 2009-159124 A | | 7/2009 |
| JP | 2009-188844 A | | 8/2009 |
| JP | 2009-218762 A | | 9/2009 |
| JP | 2009-247012 A | | 10/2009 |
| JP | 2009-247014 A | | 10/2009 |
| JP | 2009-278016 A | | 11/2009 |
| JP | 2010-245704 A | | 10/2010 |
| JP | 2010-278972 A | | 12/2010 |
| WO | 2006/134928 A1 | | 12/2006 |
| WO | WO 2012/132147 | * | 10/2012 |

OTHER PUBLICATIONS

Official Communication issued in International Patent Application No. PCT/JP2012/053101, mailed on Apr. 17, 2012.

* cited by examiner

ELECTRONIC COMPONENT INCLUDING A SURFACE ACOUSTIC WAVE ELEMENT AND A PILLAR MEMBER

BACKGROUND OF THE INVENTION

1. Field of the Invention

The present invention relates to an electronic component, and more specifically, to an electronic component including a surface acoustic wave element.

2. Description of the Related Art

As an electronic component including a surface acoustic wave element of the related art, for example, a surface acoustic wave device described in Japanese Unexamined Patent Application Publication No. 2009-159124 is known. In the surface acoustic wave device, a surface acoustic wave element is provided on a piezoelectric substrate. Further, the piezoelectric substrate is covered with a resin film. However, a cavity is provided on the surface acoustic wave element so that the resin film is not in contact with the surface acoustic wave element.

The surface acoustic wave device described in Japanese Unexamined Patent Application Publication No. 2009-159124 has a problem in that the cavity is collapsed at the time of mounting. More specifically, when a circuit module including a surface acoustic wave device is manufactured, after the surface acoustic wave device is mounted on a substrate, molding with resin is performed to cover the surface acoustic wave device. At this time, a comparatively high pressure is applied to the resin. For this reason, in the surface acoustic wave device described in Japanese Unexamined Patent Application Publication No. 2009-159124, the resin film is deformed by the pressure, and this may collapse the cavity. In particular, the cavity is more apt to be collapsed as the volume thereof increases.

SUMMARY OF THE INVENTION

Accordingly, preferred embodiments of the present invention provide an electronic component that prevents collapse of a space provided on a surface acoustic wave element.

An electronic component according to a preferred embodiment of the present invention includes a substrate, a support layer that surrounds a predetermined region on a principal surface of the substrate when viewed in plan from a normal direction of the principal surface, a surface acoustic wave element provided in the predetermined region, a cover layer provided on the support layer and opposed to the principal surface, and a pillar member that connects the principal surface and the cover layer in a space surrounded by the principal surface, the support layer, and the cover layer and that is out of contact with the support layer.

According to various preferred embodiments of the present invention, it is possible to prevent collapse of a space provided on the surface acoustic wave element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A SAW (surface acoustic wave) filter according to preferred embodiments of the present invention will be described below.

Figure 1:
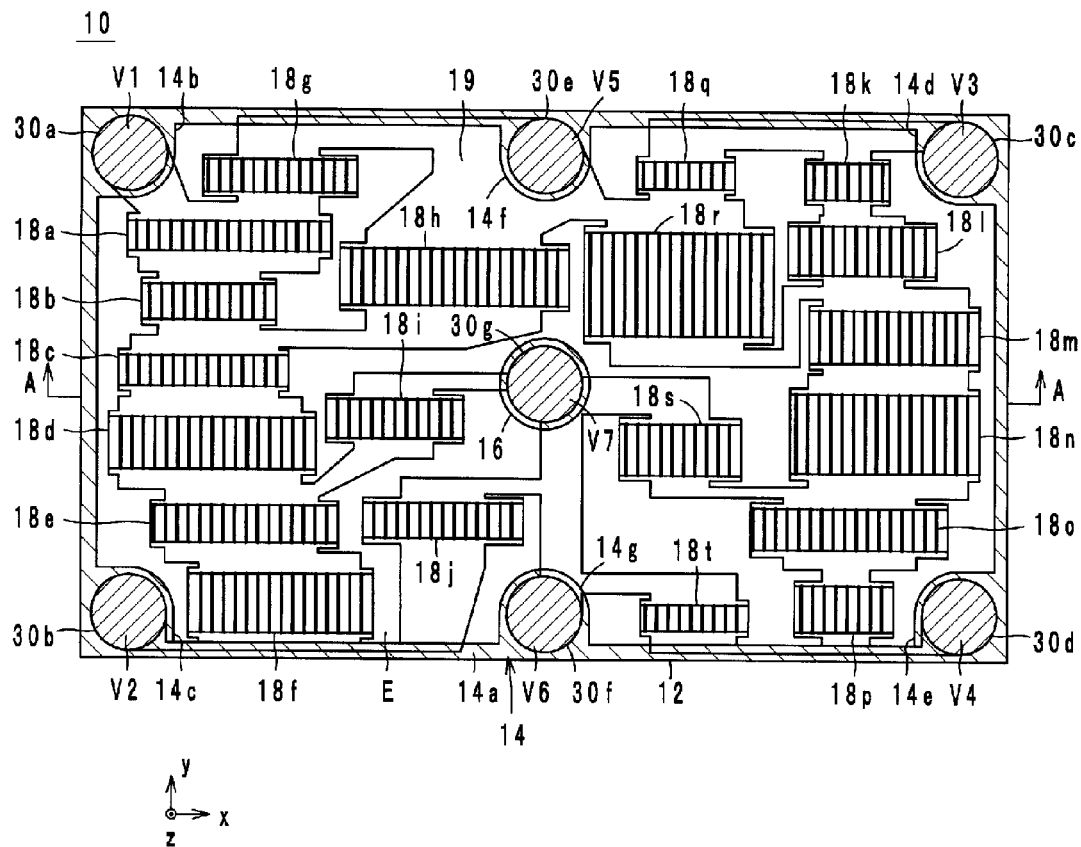
FIG. 1 is a plan view of a SAW filter according to a preferred embodiment of the present invention.
Figure 2:
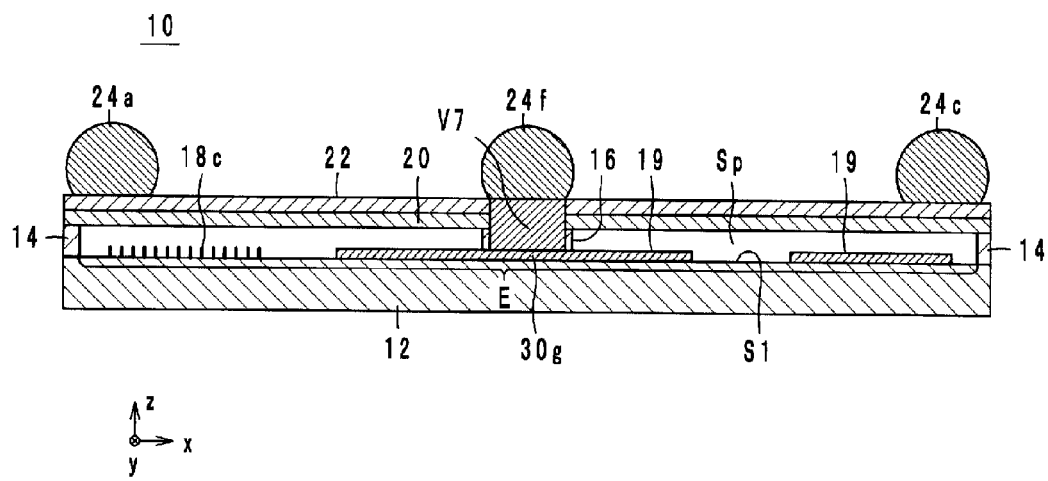
FIG. 2 is a sectional structural view of the SAW filter, taken along line A-A of FIG. 1.
Figure 3:
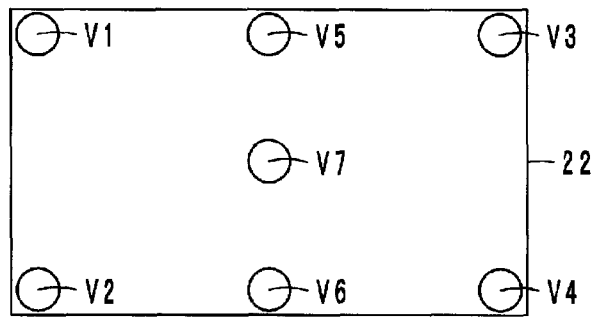
FIG. 3 is an exploded view of the SAW filter of FIG. 1.
Figure 3:
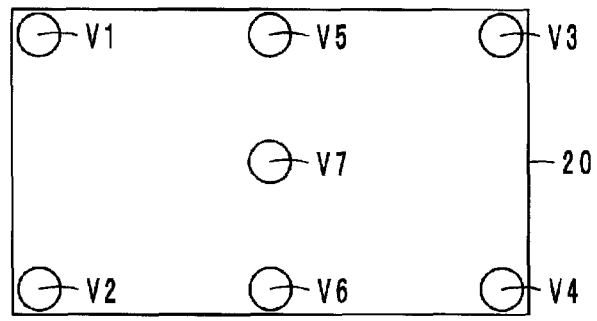
Figure 3:
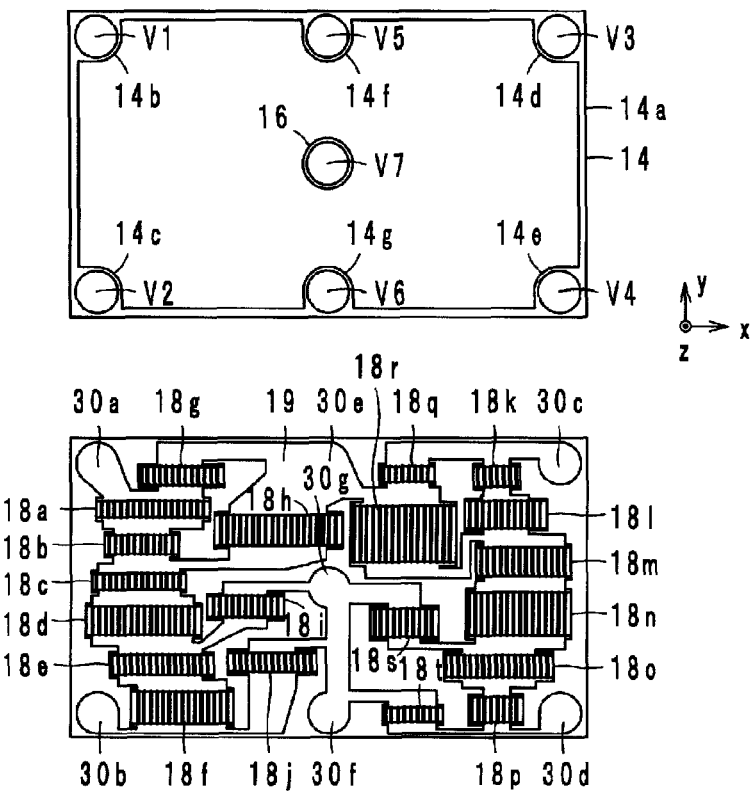
Figure 4:
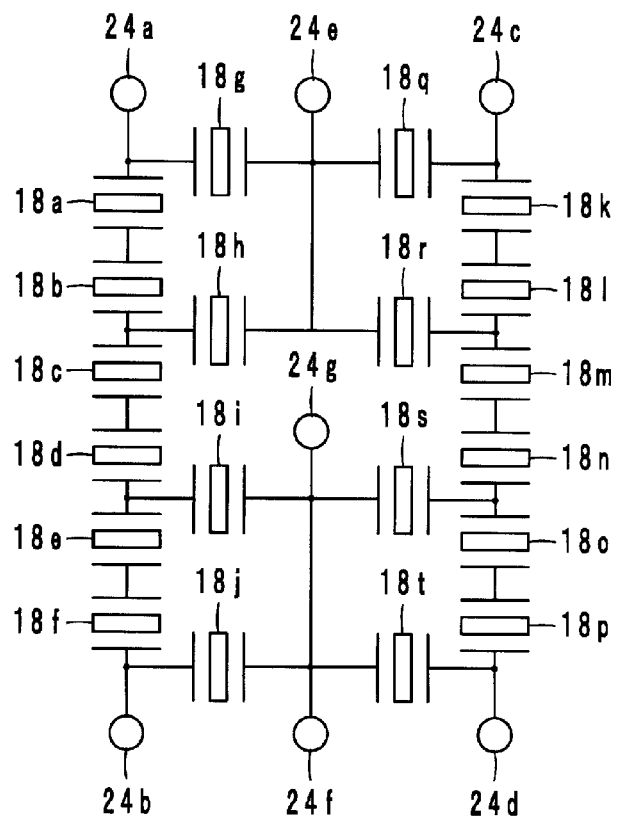
FIG. 4 is an equivalent circuit diagram of the SAW filter of FIG. 1.

First, a structure of a SAW filter will be described with reference to the drawings. FIG. 1 is a plan view of a SAW filter 10. FIG. 2 is a sectional structural view of the SAW filter 10, taken along line A-A of FIG. 1. FIG. 3 is an exploded view of the SAW filter 10 of FIG. 1. FIG. 4 is an equivalent circuit diagram of the SAW filter 10 of FIG. 1. Hereinafter, a stacking direction (vertical direction) of the SAW filter 10 is defined as a z-axis direction. Further, a direction along a long side of the SAW filter 10 is defined as an x-axis direction and a direction along a short side of the SAW filter 10 is defined as a y-axis direction when the SAW filter 10 is viewed in plan from the z-axis direction.

As illustrated in FIGS. 1 to 4, the SAW filter 10 includes a piezoelectric substrate 12, a support layer 14, a pillar member 16, surface acoustic wave elements 18 (18a to 18t), traces 19, cover layers 20 and 22, bumps (external connecting portions) 24 (24a to 24g), pads 30 (30a to 30g), and via-hole conductors V1 to V7.

The piezoelectric substrate 12 preferably is rectangular or substantially rectangular plate shaped, and includes a principal surface S1 (see FIG. 2). As the piezoelectric substrate 12, for example, a quartz substrate, an $LiTaO_3$ substrate, an $LiNbO_3$ substrate, or a substrate with a ZnO thin film is preferably used. The principal surface S1 refers to a principal surface located on a +z-axis direction side, of two principal surfaces of the piezoelectric substrate 12.

As illustrated in FIGS. 1 and 2, an element region E is defined on the principal surface S1 of the piezoelectric substrate 12. The element region E is an area on the principal surface S1 except for portions near corners and sides.

As illustrated in FIGS. 1 and 3, the support layer 14 preferably is rectangular or substantially rectangular frame shaped and surrounds the element region E, when viewed in plan from the z-axis direction. More specifically, as illustrated in FIG. 3, the support layer 14 includes a frame portion 14a and projections 14b to 14g. The frame portion 14a preferably is rectangular or substantially rectangular frame shaped and provided along four sides of the principal surface S1. The projections 14b to 14e project toward an inner side of the frame portion 14a at the four corners of the principal surface S1. The projections 14f and 14g project toward the inner side of the frame portion 14a at midpoints of long sides on +y- and −y-axis direction sides of the principal surface S1.

The support layer serves to prevent water or the like from entering the SAW filter 10, and is preferably made of a highly-water-resistant insulating material (for example, polyimide). The element region E refers to a region on the principal surface S1 where the support layer 14 is not provided.

As illustrated in FIG. 2, the cover layer 20 is provided on a +z-axis direction side of the support layer 14, and is opposed to the principal surface S1. More specifically, the cover layer 20 is preferably rectangular or substantially rectangular similar to that of the principal surface S1. The cover layer 20 is stacked on the +z-axis direction side of the support layer 14, such that it is opposed to the principal surface S1 without contact with the principal surface S1 with a space being disposed therebetween. Hereinafter, a space surrounded by the principal surface S1, the support layer 14, and a −z-axis direction side principal surface of the cover layer 20 is referred to as a space Sp. The cover layer 20 is made of an insulating material different from the insulating material for the support layer 14, and is made of epoxy, for example.

As illustrated in FIG. 2, the cover layer 22 is provided on a +z-axis direction side of the cover layer 20. More specifically, the cover layer 22 preferably is rectangular or substantially rectangular similar to the cover layer 20, and is aligned with the cover layer 20, when viewed in plan from the z-axis direction. The cover layer 22 serves to prevent water or the like from entering the SAW filter 10, and is preferably made of a highly water-resistant insulating material (for example, polyimide). That is, the cover layer 22 is made of the same insulating material as that of the support layer 14. Since the cover layer 22 is formed after the support layer 14 is set, when it is directly stacked on the support layer 14, it is unlikely to be in tight contact with the support layer 14. For this reason, in the SAW filter 10, the cover layer 20 is provided between the support layer 14 and the cover layer 22. That is, the cover layer 20 bonds the support layer 14 and the cover layer 22.

The pillar member 16 connects the principal surface S1 and the −z-axis direction side principal surface of the cover layer 20 and is out of contact with the support layer 14 in the space Sp. More specifically, the pillar member 16 preferably is a cylindrical or substantially cylindrical insulating body that is provided near an intersection of diagonal lines of the principal surface S1 (that is, near the center of the principal surface S1), when viewed in plan from the +z-axis direction, and that extends in the z-axis direction. The pillar member 16 is preferably made of the same insulating material as that of the support layer 14 (that is, polyimide). The pillar member 16 prevents the space Sp from being collapsed by deformation of the cover layers 20 and 22.

The pads 30a to 30f are preferably defined by conductive layers of Al, Cu, Ni, Au, Pt, or the like provided on the principal surface S1, and are aligned with the projections 14b to 14g of the support layer 14 when viewed in plan from the z-axis direction, as illustrated in FIGS. 1 and 3. To the pads 30a to 30f, below-described via-hole conductors V1 to V6 are connected. The pad 30g is preferably defined by a conductive layer of Al, Cu, Ni, Au, Pt, or the like provided on the principal surface S1, and is aligned with the intersection of the diagonal lines of the principal surface S1, when viewed in plan from the z-axis direction, as illustrated in FIG. 1. To the pad 30g, a below-described via-hole conductor V7 is connected.

As illustrated in FIG. 3, the via-hole conductors V1 to V6 penetrate the support layer 14 and the cover layers 20 and in the z-axis direction, and −z-axis direction end portions of the via-hole conductors V1 to V6 are connected to the pads 30a to 30f, respectively.

As illustrated in FIG. 3, the via-hole conductor V7 penetrates the pillar member 16 and the cover layers 20 and 22 in the z-axis direction. That is, the via-hole conductor V7 extends in the pillar member 16 in the z-axis direction (in a normal direction of the principal surface S1). A −z-axis direction end portion of the via-hole conductor V7 is connected to the pad 30g.

The bumps 24a to 24g are provided on a +z-axis direction side principal surface of the cover layer 22 directly on the via-hole conductors V1 to V7, and are connected to +z-axis direction side end portions of the via-hole conductors V1 to V7, respectively. The bump 24f corresponds to an external connecting portion. The bumps 24a to 24g are connected to lands on a circuit board when the SAW filter 10 is mounted on the circuit board, and for example, are defined by solder spheres.

The surface acoustic wave elements 18 are provided in the element region E. Each surface acoustic wave elements 18 is defined by a conductive layer of Al, Cu, Ni, Au, Pt, or the like provided on the principal surface S1, and two comb-shaped electrodes thereof are opposed to each other to define an IDT (Inter Digital Transducer). The surface acoustic wave element 18 defines a resonator having resonant characteristics at a resonant frequency determined by the pitch of the comb-shaped electrodes. Further, a plurality of surface acoustic wave elements 18 constitute a ladder filter including a ladder circuit. In order for the ladder filter to have desired transmission characteristics, the surface acoustic wave elements 18 have different sizes. Since the structure and principle of the surface acoustic wave elements 18 are the same as those of common surface acoustic wave elements, more detailed descriptions thereof are skipped.

The traces 19 are formed by conductive layers of Al, Cu, Ni, Au, Pt, or the like provided on the principal surface S1, and connect the surface acoustic wave elements 18 and the pads 30. A circuit configuration of the SAW filter 10 will be described in more detail below.

As illustrated in FIG. 4, the surface acoustic wave elements 18a to 18f are connected in series between the bump 24a and the bump 24b. More specifically, one comb-shaped electrode of the surface acoustic wave element 18a is connected to the bump 24a via the trace 19, the pad 30a, and the via-hole conductor V1. The other comb-shaped electrode of the surface acoustic wave element 18a is connected to one comb-shaped electrode of the surface acoustic wave element 18b via the trace 19. The other comb-shaped electrode of the surface acoustic wave element 18b is connected to one comb-shaped electrode of the surface acoustic wave element 18c via the trace 19. The other comb-shaped electrode of the surface acoustic wave element 18c is connected to one comb-shaped electrode of the surface acoustic wave element 18d via the trace 19. The other comb-shaped electrode of the surface acoustic wave element 18d is connected to one comb-shaped electrode of the surface acoustic wave element 18e via the trace 19. The other comb-shaped electrode of the surface acoustic wave element 18e is connected to one comb-shaped electrode of the surface acoustic wave element 18f via the trace 19. The other comb-shaped electrode of the surface acoustic wave element 18f is connected to the bump 24b via the trace 19, the pad 30b, and the via-hole conductor V2.

As illustrated in FIG. 4, the surface acoustic wave element 18g is connected between the bump 24a and the bump 24e. More specifically, one comb-shaped electrode of the surface acoustic wave element 18g is connected to the bump 24a via the trace 19, the pad 30a, and the via-hole conductor V1. The other comb-shaped electrode of the surface acoustic wave element 18g is connected to the bump 24e via the trace 19, the pad 30e, and the via-hole conductor V5.

As illustrated in FIG. 4, the surface acoustic wave element 18h is connected between a portion between the surface acoustic wave elements 18b and 18c and the bump 24e. More specifically, one comb-shaped electrode of the surface acoustic wave element 18h is connected to the other comb-shaped electrode of the surface acoustic wave element 18b and the one comb-shaped electrode of the surface acoustic wave element 18c via the trace 19. The other comb-shaped electrode of the surface acoustic wave element 18h is connected to the bump 24e via the trace 19, the pad 30e, and the via-hole conductor V5.

As illustrated in FIG. 4, the surface acoustic wave element 18i is connected between a portion between the surface acoustic wave elements 18d and 18e and a portion between the bumps 24g and 24f. More specifically, one comb-shaped electrode of the surface acoustic wave element 18i is connected to the other comb-shaped electrode of the surface acoustic wave element 18d and the one comb-shaped electrode of the surface acoustic wave element 18e via the trace 19. The other comb-shaped electrode of the surface acoustic wave element 18i is connected to the bump 24g via the trace 19, the pad 30g, and the via-hole conductor V7, and is also connected to the bump 24f via the trace 19, the pad 30f, and the via-hole conductor V6.

As illustrated in FIG. 4, the surface acoustic wave element 18j is connected to the bump 24b and the portion between the bumps 24g and 24f. More specifically, one comb-shaped electrode of the surface acoustic wave element 18j is connected to the bump 24b via the trace 19, the pad 30b, and the via-hole conductor V2. The other comb-shaped electrode of the surface acoustic wave element 18j is connected to the bump 24g via the trace 19, the pad 30g, and the via-hole conductor V7, and is also connected to the bump 24f via the trace 19, the pad 30f, and the via-hole conductor V6.

As illustrated in FIG. 4, the surface acoustic wave elements 18k to 18p are connected in series between the bump 24c and the bump 24d. More specifically, one comb-shaped electrode of the surface acoustic wave element 18k is connected to the bump 24c via the trace 19, the pad 30c, and the via-hole conductor V3. The other comb-shaped electrode of the surface acoustic wave element 18k is connected to one comb-shaped electrode of the surface acoustic wave element 18l via the trace 19. The other comb-shaped electrode of the surface acoustic wave element 18l is connected to one comb-shaped electrode of the surface acoustic wave element 18m via the trace 19. The other comb-shaped electrode of the surface acoustic wave element 18m is connected to one comb-shaped electrode of the surface acoustic wave element 18n via the trace 19. The other comb-shaped electrode of the surface acoustic wave element 18n is connected to one comb-shaped electrode of the surface acoustic wave element 18o via the trace 19. The other comb-shaped electrode of the surface acoustic wave element 18o is connected to one comb-shaped electrode of the surface acoustic wave element 18p via the trace 19. The other comb-shaped electrode of the surface acoustic wave element 18p is connected to the bump 24d via the trace 19, the pad 30d, and the via-hole conductor V4.

As illustrated in FIG. 4, the surface acoustic wave element 18q is connected between the bump 24c and the bump 24e. More specifically, one comb-shaped electrode of the surface acoustic wave element 18q is connected to the bump 24c via the trace 19, the pad 30c, and the via-hole conductor V3. The other comb-shaped electrode of the surface acoustic wave element 18q is connected to the bump 24e via the trace 19, the pad 30e, and the via-hole conductor V5.

As illustrated in FIG. 4, the surface acoustic wave element 18r is connected between a portion between the surface acoustic wave elements 18l and 18m and the bump 24e. More specifically, one comb-shaped electrode of the surface acoustic wave element 18r is connected to the other comb-shaped electrode of the surface acoustic wave element 18l and the one comb-shaped electrode of the surface acoustic wave element 18m via the trace 19. The other comb-shaped electrode of the surface acoustic wave element 18r is connected to the bump 24e via the trace 19, the pad 30e, and the via-hole conductor V5.

As illustrated in FIG. 4, the surface acoustic wave element 18s is connected to a portion between the surface acoustic wave elements 18n and 18o and to the portion between the bumps 24g and 24f. More specifically, one comb-shaped electrode of the surface acoustic wave element 18s is connected to the other comb-shaped electrode of the surface acoustic wave element 18n and the one comb-shaped electrode of the surface acoustic wave element 18o via the trace 19. The other comb-shaped electrode of the surface acoustic wave element 18s is connected to the bump 24g via the trace 19, the pad 30g, and the via-hole conductor V7, and is also connected to the bump 24f via the trace 19, the pad 30f, and the via-hole conductor V6.

As illustrated in FIG. 4, the surface acoustic wave element 18t is connected to the bump 24d and the portion between the bumps 24g and 24f. More specifically, one comb-shaped electrode of the surface acoustic wave element 18t is connected to the bump 24d via the trace 19, the pad 30d, and the via-hole conductor V4. The other comb-shaped electrode of the surface acoustic wave element 18t is connected to the bump 24g via the trace 19, the pad 30g, and the via-hole conductor V7, and is also connected to the bump 24f via the trace 19, the pad 30f, and the via-hole conductor V6.

In the SAW filter 10 having the above-described configuration, the bump 24a is used as an input terminal for a radio frequency signal of a 900 MHz band, and the bump 24b is used as an output terminal for the radio frequency signal of the 900 MHz band. Further, the bumps 24e to 24g are grounded. Thus, the surface acoustic wave elements 18a to 18j function as a SAW filter that transmits the radio frequency signal of the 900 MHz band.

Further, the bump 24c is used as an input terminal for a radio frequency signal of a 850 MHz band, and the bump 24d is used as an output terminal for the radio frequency signal of the 850 MHz band. The bumps 24e to 24g are grounded. Thus, the surface acoustic wave elements 18k to 18t function as a SAW filter that transmits the radio frequency signal of the 850 MHz band.

Figure 5:
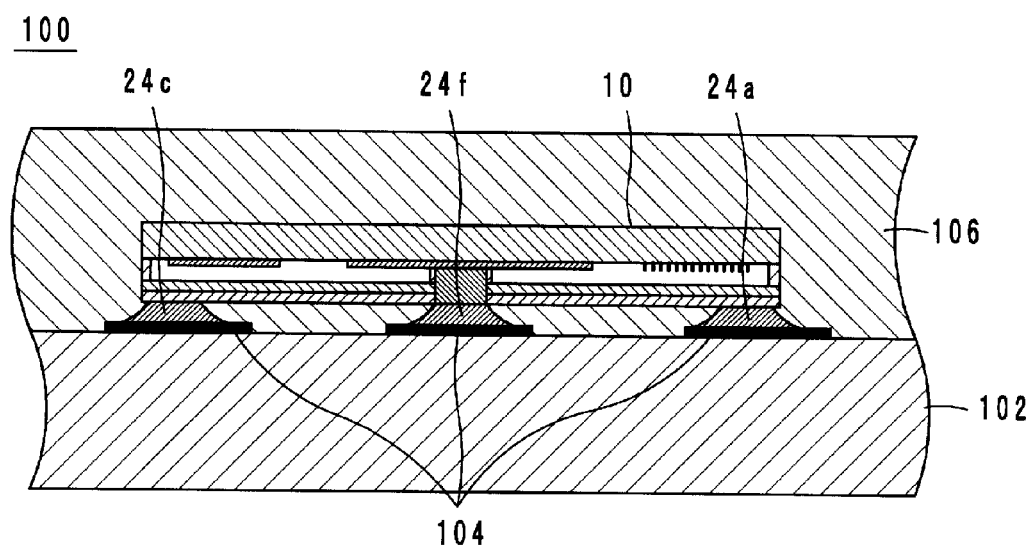
FIG. 5 is a sectional structural view of a circuit module in which the SAW filter is mounted according to a preferred embodiment of the present invention.

The SAW filter 10 having the above-described configuration is mounted in a circuit board to be used as a circuit module. Hereinafter, a description will be given of the circuit module in which the SAW filter 10 is mounted, with reference to the drawings. FIG. 5 is a sectional structural view of a circuit module 100 in which the SAW filter 10 is mounted.

The circuit module 100 includes the SAW filter 10, a circuit board 102, lands 104, and mold resin 106. The circuit board 102 is a multilayered wiring board. The lands 104 are outer electrodes provided on a principal surface of the circuit board 102.

The SAW filter 10 is mounted on the circuit board 102 such that the bumps 24 are in contact with the lands 104. The bumps 24 are spread on the lands 104 by being melted at the time of mounting. Thus, the SAW filter 10 is fixed onto the circuit board 102. The mold resin 106 covers the SAW filter 10 and the principal surface of the circuit board 102. The SAW filter 10 is thereby protected.

A preferred embodiment of a manufacturing method for the SAW filter 10 will be described below with reference to the drawings. FIGS. 6 and 7 are cross-sectional views illustrating manufacturing steps for the SAW filter 10. While the manufacturing method for one SAW filter 10 will be described below, in actuality, a plurality of SAW filters 10 arranged in a matrix are simultaneously manufactured, and are finally divided into individual SAW filters 10.

Figure 6A:
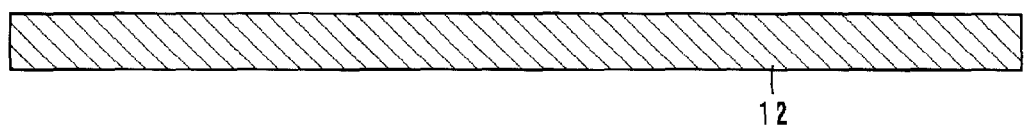
FIGS. 6A-6C include cross-sectional views illustrating manufacturing steps for the SAW filter according to a preferred embodiment of the present invention.

First, as illustrated in FIG. 6A, a piezoelectric substrate 12 is prepared.

Figure 6B:
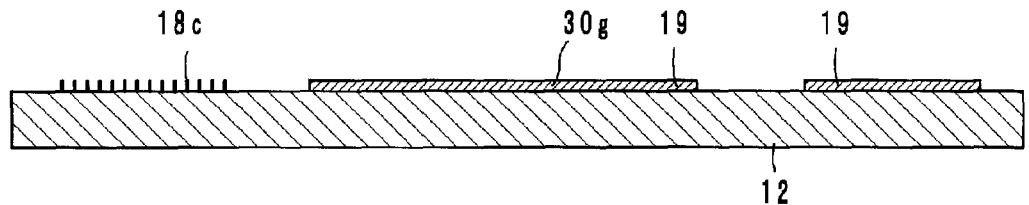

Next, as illustrated in FIG. 6B, surface acoustic wave elements 18, traces 19, and pads 30 are formed on a principal surface S1 of the piezoelectric substrate 12 by photolithography. Specifically, a resist pattern having apertures where the surface acoustic wave elements 18, the traces 19, and the pads are to be formed is formed. Next, a film formed of metal mainly containing Al is formed on the resist pattern and the apertures by vapor deposition. Next, the resist pattern is removed by being dipped in a removing solution. At this time, the metal film on the resist pattern is also removed. Thus, the surface acoustic wave elements 18, the traces 19, and the pads 30 are formed on the principal surface S1.

Figure 6C:
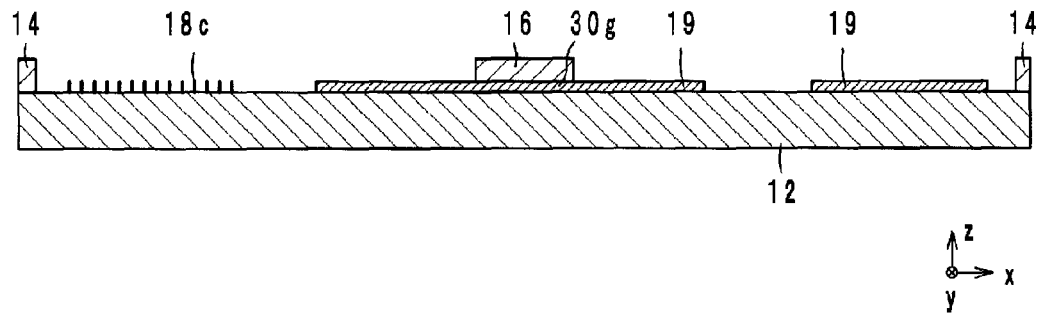

Next, as illustrated in FIG. 6C, a support layer 14 and a pillar member 16 are formed on the principal surface S1 of the piezoelectric substrate 12 by photolithography. Specifically, photosensitive polyimide is applied onto the principal surface S1 of the piezoelectric substrate 12 by spin coating. Next, the photosensitive polyimide is exposed and developed. Further, the photosensitive polyimide is set by heating, and organic materials attached to the surface acoustic wave elements 18 are removed by oxygen plasma. Thus, the support layer 14 and the pillar member 16 are formed.

Figure 7A:
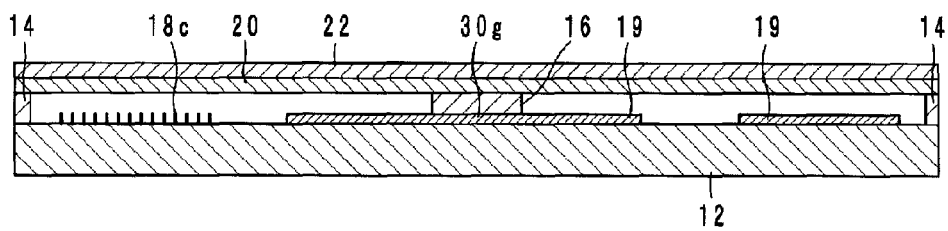
FIGS. 7A-7C include cross-sectional views illustrating manufacturing steps for the SAW filter according to a preferred embodiment of the present invention.

Next, as illustrated in FIG. 7A, cover layers 20 and are formed on the support layer 14. More specifically, a laminated film in which a cover layer 20 formed by an epoxy film and a cover layer 22 formed by a polyimide film are stacked is prepared. Then, the laminated film is placed on the support layer 14 and is subjected to thermocompression bonding.

Figure 7B:
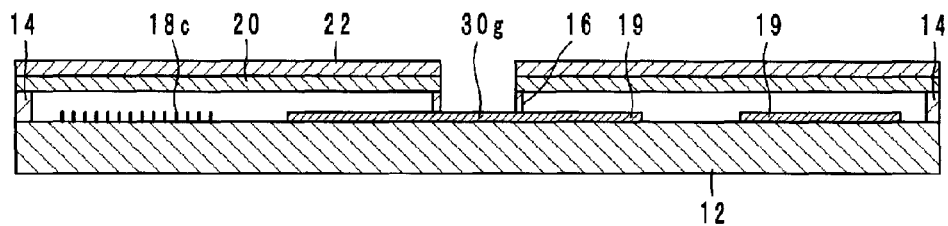

Next, as illustrated in FIG. 7B, via holes are formed in the support layer 14, the pillar member 16, and the cover layers 20 and 22 by applying a beam to positions where via-hole conductors V1 to V7 are to be formed. The method for forming the via holes is not limited to the method using beam application, but may be photolithography.

Figure 7C:
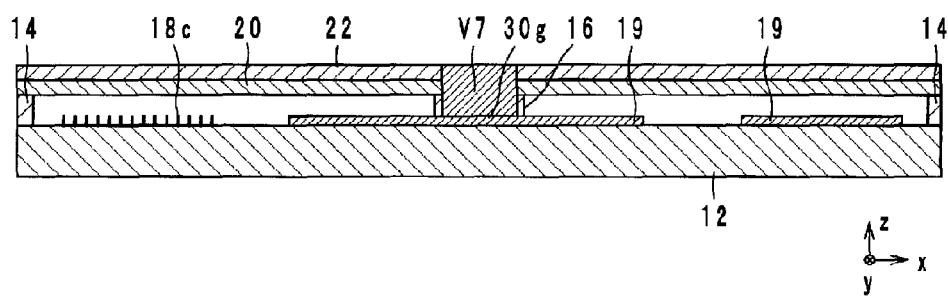

Next, as illustrated in FIG. 7C, via-hole conductors V1 to V7 are formed by filling the via holes with conductors by electroplating. Since peripheries of the via-hole conductors V1 to V7 are surrounded by the support layer 14, plating solution is restricted from entering a space Sp.

Finally, as illustrated in FIG. 2, solder paste is printed on the via-hole conductors V1 to V7 to form bumps 24a to 24g. Through the above-described steps, a SAW filter 10 is provided. Since the above-described manufacturing method for the SAW filter 10 is just an example, the SAW filter 10 may be manufactured by other methods.

According to the SAW filter 10 having the above-described structure, it is possible to prevent collapse of the space Sp provided on the surface acoustic wave elements 18. More specifically, when a circuit module including the surface acoustic wave device described in Japanese Unexamined Patent Application Publication No. 2009-159124 is manufactured, after the surface acoustic wave device is mounted on a substrate, it is covered by being molded with resin. At this time, a comparatively high pressure is applied to the resin. For this reason, in the surface acoustic wave device described in Japanese Unexamined Patent Application Publication No. 2009-159124, the resin film is deformed by the pressure, and this may collapse a cavity. In particular, the cavity is more apt to be collapsed as the volume of the cavity increases.

In contrast, in the SAW filter 10, as illustrated in FIG. 2, the pillar member 16 is provided in the space Sp to connect the principal surface S1 and the −z-axis direction side principal surface of the cover layer 20. Thus, even if pressure is applied to the cover layers 20 and 22 during mounting of the SAW filter 10, the cover layers 20 and 22 are restricted from deformation because they are supported by the pillar member 16. As a result, collapse of the space Sp is prevented in the SAW filter 10.

Further, the degree of flexibility in design is high in the SAW filter 10. More specifically, the pillar member 16 is out of contact with the support layer 14 in the SAW filter 10. That is, the pillar member 16 can be provided at a position in the element region E apart from the support layer 14. Hence, the pillar member 16 can be provided at an arbitrary position in the element region E. Therefore, the pillar member 16 can be provided at a position in the element region E where the surface acoustic wave elements 18, the traces 19, and the pads 30 are not provided. As a result, the degree of flexibility in design is high in the SAW filter 10.

Further, high radiation performance can be obtained in the SAW filter 10. More specifically, the via-hole conductor V7 penetrates the pillar member 16 and the cover layers 20 and 22 in the z-axis direction in the SAW filter 10. Further, the via-hole conductor V7 is connected to the trace 19 via the pad 30g. For this reason, heat generated by the application of an RF voltage to the SAW filter 10 is radiated out of the SAW filter 10 via the via-hole conductor V7. As a result, power durability can be enhanced in the SAW filter 10.

In the SAW filter 10, the attenuation characteristics between the bump 24a and the bump 24b and between the bump 24c and the bump 24d and the isolation characteristics between the bumps 24 other than the bump 24a and the bump 24b and between the bumps 24 other than the bump 24c and the bump 24d are improved. More specifically, the via-hole conductor V7 is connected to the bump 24f to which the ground potential is applied. Thus, in the SAW filter 10, the ground potential is applied to more portions than when the via-hole conductor V7 is not provided. As a result, the attenuation characteristics and the isolation characteristics are improved in the SAW filter 10. Particularly when the SAW filter 10 is used in a cellular phone, for example, isolation characteristics between transmission and reception are improved in a duplexer circuit of the cellular phone.

In the circuit module 100 in which the SAW filter 10 is mounted, the occurrence of ripples can be suppressed. More specifically, in the SAW filter 10, vibrations in the z-axis direction are generated and this causes ripples. As a measure to prevent this, the SAW filter 10 is covered with the mold resin 106 in the circuit module 100. For this reason, the vibrations in the z-axis direction are absorbed by the mold resin 106. As a result, the occurrence of ripples is suppressed.

In the SAW filter 10, the via-hole conductor V7 and the bump 24f are directly connected, and therefore, a trace for connecting them is not used. As a result, an inductance component and a capacitor component are prevented from being generated by the trace, and this prevents characteristic degradation of the SAW filter 10.

First Modification

Figure 8:
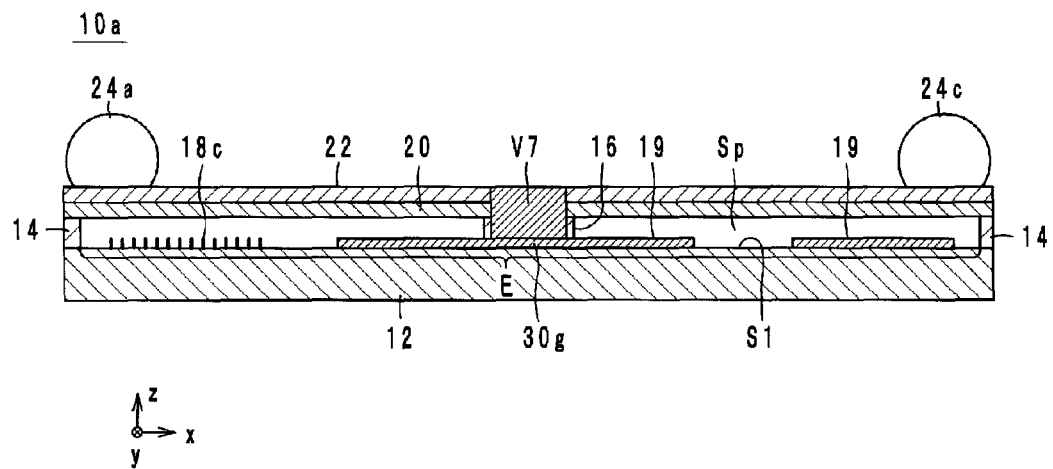
FIG. 8 is a sectional structural view of a SAW filter according to a first modification of a preferred embodiment of the present invention.

A SAW filter according to a first modification of a preferred embodiment of the present invention will be described below with reference to the drawing. FIG. 8 is a sectional structural view of a SAW filter 10a according to the first modification.

In the SAW filter 10a, as illustrated in FIG. 8, the bump 24f may be omitted. In the SAW filter 10a, it is also possible to prevent collapse of a space Sp and to obtain high heat radiation performance.

Second Modification

Figure 9:
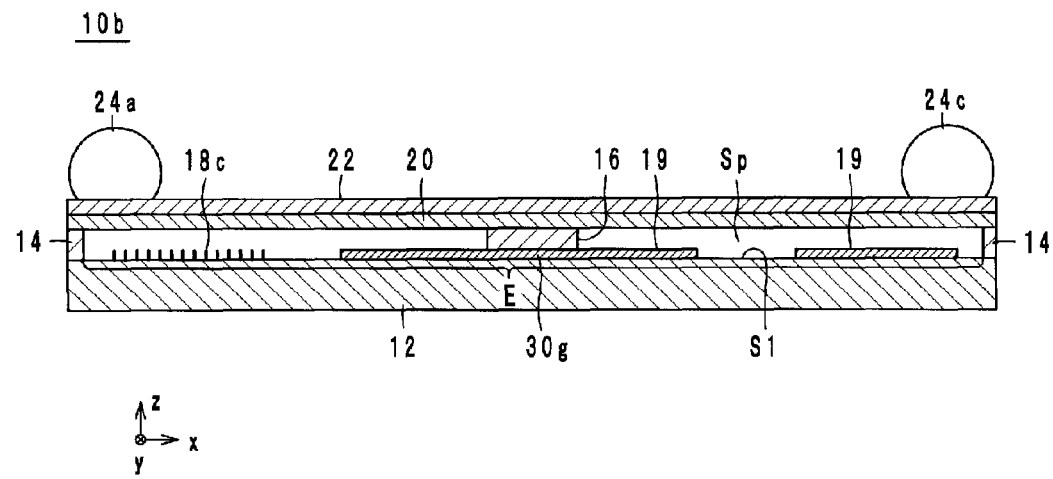
FIG. 9 is a sectional structural view of a SAW filter according to a second modification of a preferred embodiment of the present invention.

A SAW filter according to a second modification of a preferred embodiment of the present invention will be described below with reference to the drawing. FIG. 9 is a sectional structural view of a SAW filter 10b according to the second modification.

In the SAW filter 10b, as illustrated in FIG. 9, the bump 24f and the via-hole conductor V7 may be omitted. In the SAW filter 10b, collapse of a space Sp can also be prevented.

Other Preferred Embodiments

The SAW filter of the present invention is not limited to the SAW filters 10, 10a, and 10b of the above-described preferred embodiments, and can be modified within the scope thereof.

In the SAW filters 10, 10a, and 10b, a plurality of pillar members 16 may be provided.

While the pillar member 16 is preferably shaped like a cylinder, for example, it may be shaped like a prism.

Preferably, the cross-sectional area of the via-hole conductor V7 along a plane parallel or substantially parallel to the principal surface S1 is larger than the cross-sectional area of the via-hole conductors V1 to V6 along the plane parallel or substantially parallel to the principal surface. The via-hole conductor V7 provides the greatest heat radiation effect and the greatest ground effect. Therefore, the heat radiation effect and the ground effect can be increased by making the cross-sectional area of the via-hole conductor V7 the largest. Further, when the cross-sectional area of the via-hole conductor V7 increases, collapse of the space Sp is more effectively prevented.

As described above, preferred embodiments of the present invention are useful for an electronic component, and is excellent particularly in its capability of preventing collapse of a space provided on a surface acoustic wave element.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a substrate;
   a support layer that surrounds a predetermined region on a principal surface of the substrate, when viewed in plan from a normal direction of the principal surface;
   a surface acoustic wave element provided in the predetermined region;
   a cover layer provided on the support layer and opposed to the principal surface;
   a pillar member that connects the principal surface and the cover layer in a space surrounded by the principal surface, the support layer, and the cover layer and that does not contact with the support layer; and
   a first via hole conductor extending in the pillar member in the normal direction of the principal surface; wherein the pillar member is mad of resin.

2. The electronic component according to claim 1, further comprising:
   a trace connected to the first via-hole conductor and provided on the principal surface; and
   an external connecting portion to which a ground potential is applied, the external connecting portion being connected to the first via-hole conductor and provided on a portion of the cover layer directly on the first via-hole conductor.

3. The electronic component according to claim 2, wherein the external connecting portion is defined by at least one conductive bump.

4. The electronic component according to claim 1, wherein the support layer and the pillar member are made of a same material.

5. The electronic component according to claim 1, wherein the cover layer includes:
   a first cover layer provided on the support layer and made of a material different from a material of the support layer; and
   a second cover layer provided on the first cover layer and made of a same material as the material of the support layer.

6. The electronic component according to claim 5, wherein the second cover layer and the support layer are made of a water-resistance insulating material.

7. The electronic component according to claim 5, wherein the first cover layer bonds the support layer and the second cover layer.

8. The electronic component according to claim 1, wherein the surface acoustic wave element defines a surface acoustic wave filter.

9. The electronic component according to claim 1, wherein a plurality of the surface acoustic wave elements are provided in the predetermined region.

10. The electronic component according to claim 1, wherein the pillar member is provided at a center or substantially at the center of the principal surface.

11. The electronic component according to claim 10, further comprising:
   a second via-hole conductor extending in the support layer in the normal direction of the principal surface; wherein a cross-sectional area of the first via-hole conductor along a plane parallel or substantially parallel to the principal surface is larger than a cross-sectional area of the second via-hole conductor along the plane parallel or substantially parallel to the principal surface.

12. The electronic component according to claim 1, wherein the substrate is a piezoelectric substrate that is rectangular or substantially rectangular plate shaped and is one of a quartz substrate, an $LiTaO_3$ substrate, an $LiNbO_3$ substrate, and a substrate with a ZnO thin film.

13. The electronic component according to claim 1, wherein the predetermined region is an area on the principal surface excluding portions near corners and sides thereof.

14. The electronic component according to claim 1, wherein the support layer includes a frame portion and a plurality of projections.

15. The electronic component according to claim 1, wherein the pillar member is a cylindrical or substantially cylindrical insulating body.

16. The electronic component according to claim 1, further comprising a plurality of conductive pads aligned with projections of the support layer and arranged to be connected to via hole conductors.

17. The electronic component according to claim 1, wherein the surface acoustic wave element includes a plurality of surface acoustic wave resonators arranged to define a ladder circuit.

18. The electronic component according to claim 1, wherein the surface acoustic wave element defines a resonator having resonant characteristics at a resonant frequency determined by a pitch of comb-shaped electrodes thereof.

19. A circuit module comprising:
- a circuit board;
- a plurality of lands on the circuit board;
- the electronic component according to claim 1 mounted on the circuit board via the plurality of lands; and
- a resin cover arranged on the circuit board to cover the electronic component.

* * * * *